(12) United States Patent
Barbe et al.

(10) Patent No.: US 8,343,780 B2
(45) Date of Patent: Jan. 1, 2013

(54) METHOD OF STRESSING A THIN PATTERN (75) Inventors: Jean-Charles Barbe, Grenoble (FR); Thomas Ernst, Charnecles (FR)

(73) Assignee: Commissariat a l'Energie Atomique, Paris (FR)

( * ) Notice: Subject to any disclaimer, the term of this patent is extended or adjusted under 35 U.S.C. 154(b) by 966 days.

(21) Appl. No.: 11/172,945

(22) Filed: Jul. 5, 2005

(65) Prior Publication Data
US 2006/0091105 A1 May 4, 2006

(30) Foreign Application Priority Data
Jul. 5, 2004 (FR) .................................... 04 51440

(51) Int. Cl.
*H01L 21/302* (2006.01)

(52) U.S. Cl. .......... 438/14; 438/689; 438/694; 438/724; 438/938

(58) Field of Classification Search ........................ None
See application file for complete search history.

(56) References Cited

U.S. PATENT DOCUMENTS

| | | | |
|---|---|---|---|
| 5,532,510 A | 7/1996 | Amorai-Moriya et al. | |
| 6,492,216 B1 * | 12/2002 | Yeo et al. | 438/197 |
| 6,563,152 B2 | 5/2003 | Roberds et al. | |
| 6,841,001 B2 * | 1/2005 | Saxler | 117/84 |
| 6,924,182 B1 * | 8/2005 | Xiang et al. | 438/197 |
| 6,989,570 B2 * | 1/2006 | Skotnicki et al. | 257/347 |
| 7,306,997 B2 * | 12/2007 | Xiang et al. | 438/300 |
| 7,326,601 B2 * | 2/2008 | Wirbeleit et al. | 438/151 |
| 7,504,704 B2 * | 3/2009 | Currie et al. | 257/510 |
| 2003/0080361 A1 * | 5/2003 | Murthy et al. | 257/288 |
| 2003/0155592 A1 | 8/2003 | Shima et al. | |
| 2005/0106792 A1 * | 5/2005 | Cea et al. | 438/197 |
| 2005/0202640 A1 * | 9/2005 | Fitzgerald et al. | 438/287 |
| 2005/0279992 A1 * | 12/2005 | Gupta et al. | 257/24 |
| 2005/0280026 A1 * | 12/2005 | Isaacson et al. | 257/192 |
| 2006/0011990 A1 * | 1/2006 | Furukawa et al. | 257/377 |
| 2006/0017138 A1 * | 1/2006 | Ting | 257/632 |
| 2006/0019462 A1 * | 1/2006 | Cheng et al. | 438/400 |

FOREIGN PATENT DOCUMENTS
EP 1 231 643 A2 8/2002

OTHER PUBLICATIONS

O. Rayssac, et al., "From SOI to SOIM Technology: Application for specific semiconductor processes", Electrochemical Society Proceedings, vol. 2001-3, XP-008043050, 2001, pp. 39-44.
K. Rim, et al., "Fabrication and Mobility Characteristics of Ultra-thin Strained Si Directly on Insulator (SSDOI) MOSFETs", International Electron Devices Meeting, XP-010683956, Dec. 8, 2003, pp. 49-52.

* cited by examiner

*Primary Examiner* — Anita Alanko
(74) *Attorney, Agent, or Firm* — Oblon, Spivak, McClelland, Maier & Neustadt, L.L.P.

(57) ABSTRACT

The invention relates to a method for straining or deforming a pattern or a thin layer (24), starting from an initial component comprising the said thin layer and a prestressed layer (20), this method comprising:
an etching step of the prestressed layer, perpendicular to its surface.

35 Claims, 8 Drawing Sheets

METHOD OF STRESSING A THIN PATTERN

TECHNICAL FIELD AND PRIOR ART

The invention relates to the field of semiconductors and microelectronics.

Integrated circuits are normally constructed on silicon substrates. These substrates may be composed of one or several layers of different natures (for example Silicon On Insulator SOI) but the layer in which the electronic transport takes place is always formed from a semiconducting material.

Figure 1:
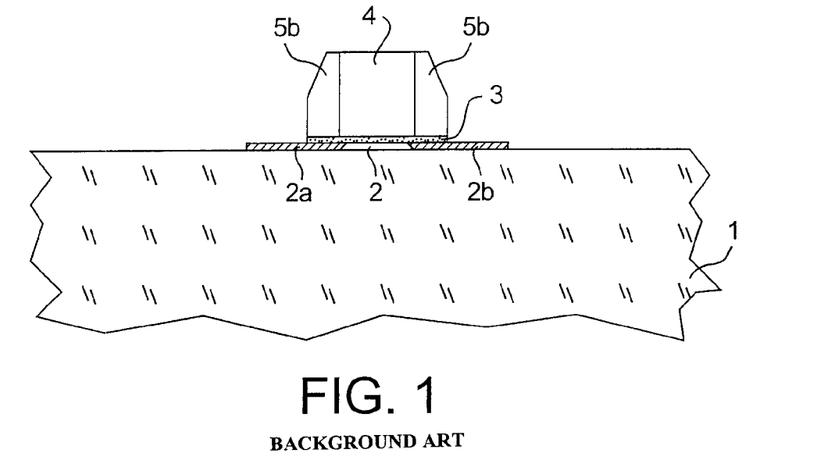
FIG. 1 shows a diagrammatic view of a transistor.

As shown on the diagram in FIG. 1, these integrated circuits are formed from millions of transistors as close to the substrate as possible (area marked 1 in FIG. 1), each transistor comprising a gate 4 a few tens of nanometers wide and a channel 2 located under the gate and separated from it by an electrical insulator 3.

Access areas to this transport area formed by the channel are called the source and the drain (areas 2a and 2b respectively shown cross-hatched in, FIG. 1).

Spacers are placed on each side of the gate (references 5a and 5b in FIG. 1).

The gate controls the number of carriers in the channel and therefore the current that passes between the source and the drain.

The transistor is said to be of the N type if conduction in the channel takes place using electrons; impurities in the source and the drain are then of the N type (electron donor atoms) and the term NMOS transistor is used.

The transistor is said to be of the P type if conduction in the channel takes place using holes; impurities in the source and the drain are then of the P type (electron acceptor atoms) and the term PMOS transistor is used.

A current can then pass from the source to the drain through the channel under specific polarisation conditions between the gate, the source and the drain.

Document U.S. Pat. No. 6,563,152 describes a method for straining the transport area in a transistor.

The technique described in this document uses several technological steps, and particularly addition of material to stress the channel of a MOS type transistor after it has been formed.

The method used comprises three etching steps: the first two are anisotropic etchings and the second is an isotropic etching. As shown in this document, these steps expose the back face of the channel. The cavity formed under the channel is then filled in with a semiconducting or insulating material that must stress the channel due to a difference in the mesh size or the coefficient of expansion between the infill semiconducting or insulating material and the semiconducting material from which the channel is made, and that therefore strains the layer in which the three etching steps are performed.

The problem that arises is to simplify the method for producing a stressed channel, since the steps described in the document mentioned above are complex.

There is another serious implementation difficulty with the method proposed in the above-mentioned patent; as long as the deposited layer of material that fills in the area under the channel is thin compared with the total thickness of the technological stack that already exists on the surface of the channel (this stack being denoted by references 12-14, 22 and 26 in FIG. 3 in the above-mentioned patent), the deposited material is affected by the elastic stiffness of the stack and therefore strains it only very slightly. Therefore, the exposed cavity must be large compared with the height of the gate stack that is typically of the order of 100 nm, particularly if the modulus of elasticity of the filling material is low.

Therefore, the problem that arises is to find another method to stress a thin pattern, and particularly in a transistor channel.

PRESENTATION OF THE INVENTION

The invention relates to a method for producing a thin stressed pattern or increasing the stress in such a pattern, starting from an initial stack comprising the said thin layer and a prestressed layer.

The invention relates to a method for straining or deforming a pattern or a thin layer, or increasing a stress or a deformation in a pattern or a thin layer starting from an initial stack comprising the said thin layer and a prestressed layer, this method comprising:

an etching step of the prestressed layer.

The invention also relates to a method for straining or deforming a pattern or a thin layer, or increasing a stress or a deformation in a pattern or a thin layer, this method comprising:

supplying a substrate with a prestressed layer on the surface on which the said pattern or the said thin layer lies, a step to etch the prestressed layer.

A method according to the invention can be used to stress or deform a pattern or a thin layer, or to increase a stress or deformation in a pattern or a thin layer, by transferring the deformation (or the prestress) in a prestressed layer located under the pattern and possibly on a substrate, into this pattern or this thin layer.

Therefore the invention relates to a method using a prestressed layer on the surface of which there is a film or a layer or a thin pattern, for example made of silicon or any other semiconductor used in microelectronics.

The stressed layer, and therefore the thin film located on the surface of the prestressed layer, is etched laterally on each side of a pattern defined in the said thin film so that it can relax in the direction perpendicular to the etching and thus stress the thin pattern.

Therefore, the invention relates to a method for straining a thin pattern by transferring the stress from a subjacent layer to the pattern by means of in-depth lateral etching of the prestressed layer, and possibly of intermediate layers, for example vertically in line with the pattern, by anisotropic or isotropic etching.

Etching may be done through all or part of the thickness of the prestressed layer and the etching depth may be optimised to take advantage of the geometric singularity at the bottom of the etching to exceed the maximum stress calculated assuming linear elastic behaviour.

Control over the tension (or compression) state of a thin pattern can improve the performances of a stack or an NMOS (or PMOS) transistor type component by constraining the channel of the said transistor.

This control is achieved by varying the etching depth, the thickness of the thin film or the (etched thickness)/(film thickness) ratio.

This control can also be achieved by controlling the initial stress in the prestressed layer and the nature of the materials, in other words the elastic properties (Young's Modulus and Poisson's Ratio) of the materials being used.

This method can be used for various purposes including controlled stress of a transistor channel to modify electronic transport properties.

For example, the prestressed layer may be made of $Si_3N_4$.

The initial stack may also contain one or several layers inserted between the pattern or the thin layer, and the prestressed layer.

The sum of the thicknesses of the intermediate layers and the thickness of the pattern or the thin layer is preferably small compared with the etched thickness of the prestressed layer.

The prestressed layer of the initial component preferably lies on a substrate, for example comprising one or several layers.

The thickness of the prestressed layer before etching is preferably small compared with the thickness of the substrate.

A buffer or mechanical resistance layer, for example made of $SiO_2$, can be placed between the prestressed layer and the substrate.

Etching of the prestressed layer leads to the formation of lateral cavities in this prestressed layer that can then be filled in by a material.

This material used to fill in the lateral cavities can itself be in an intrinsically stressed state, or a stressed state due to different coefficients of thermal expansion of this material and of the material from which the thin pattern is formed, resulting from etching and relaxation of the prestressed layer.

The invention also relates to a method for the formation of a transistor comprising a method for straining a thin layer like that described above, and the formation of a gate, spacers and the implantation or diffusion of source and drain access areas.

DETAILED PRESENTATION OF PARTICULAR EMBODIMENTS

Figure 2:
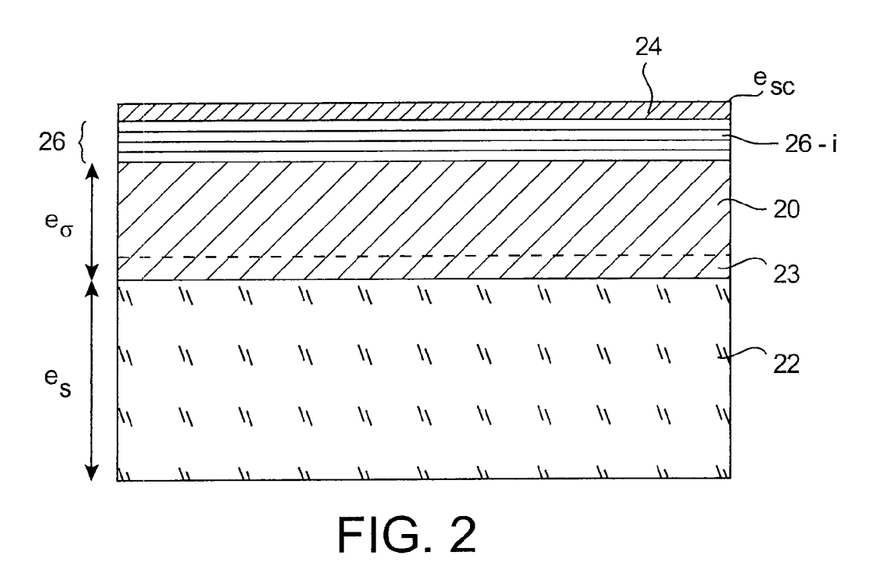
FIG. 2 shows a technological stack forming an initial substrate for a method according to the invention.
Figure 3A:
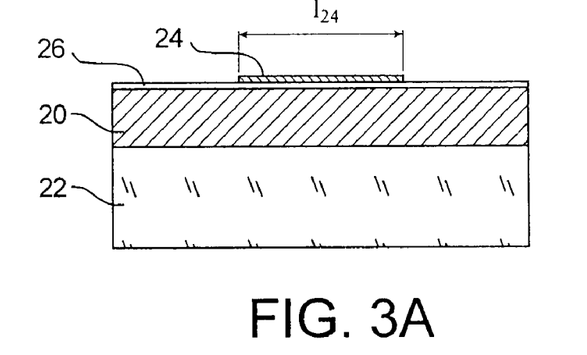
FIGS. 3A-3C show steps in a method according to the invention.
Figure 3B:
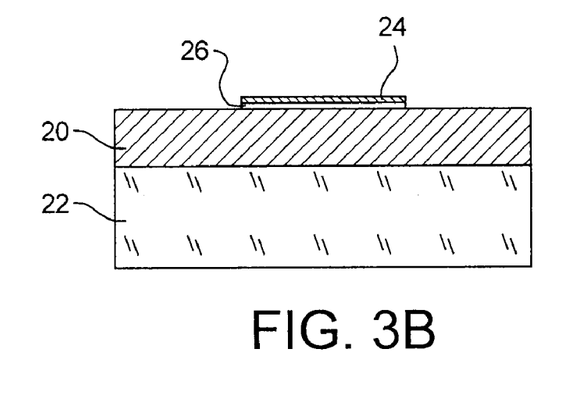
Figure 3C:
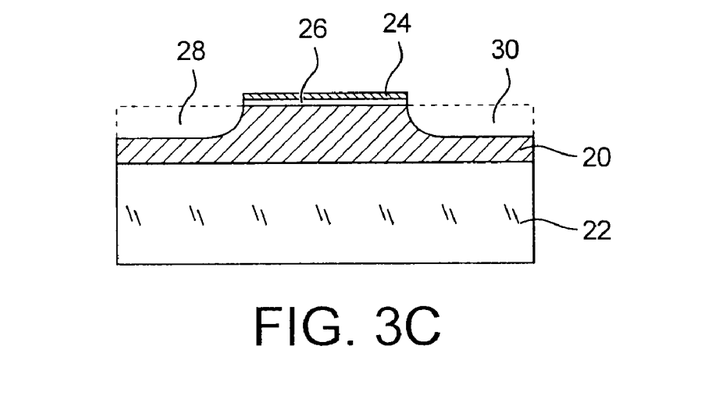
Figure 4A:
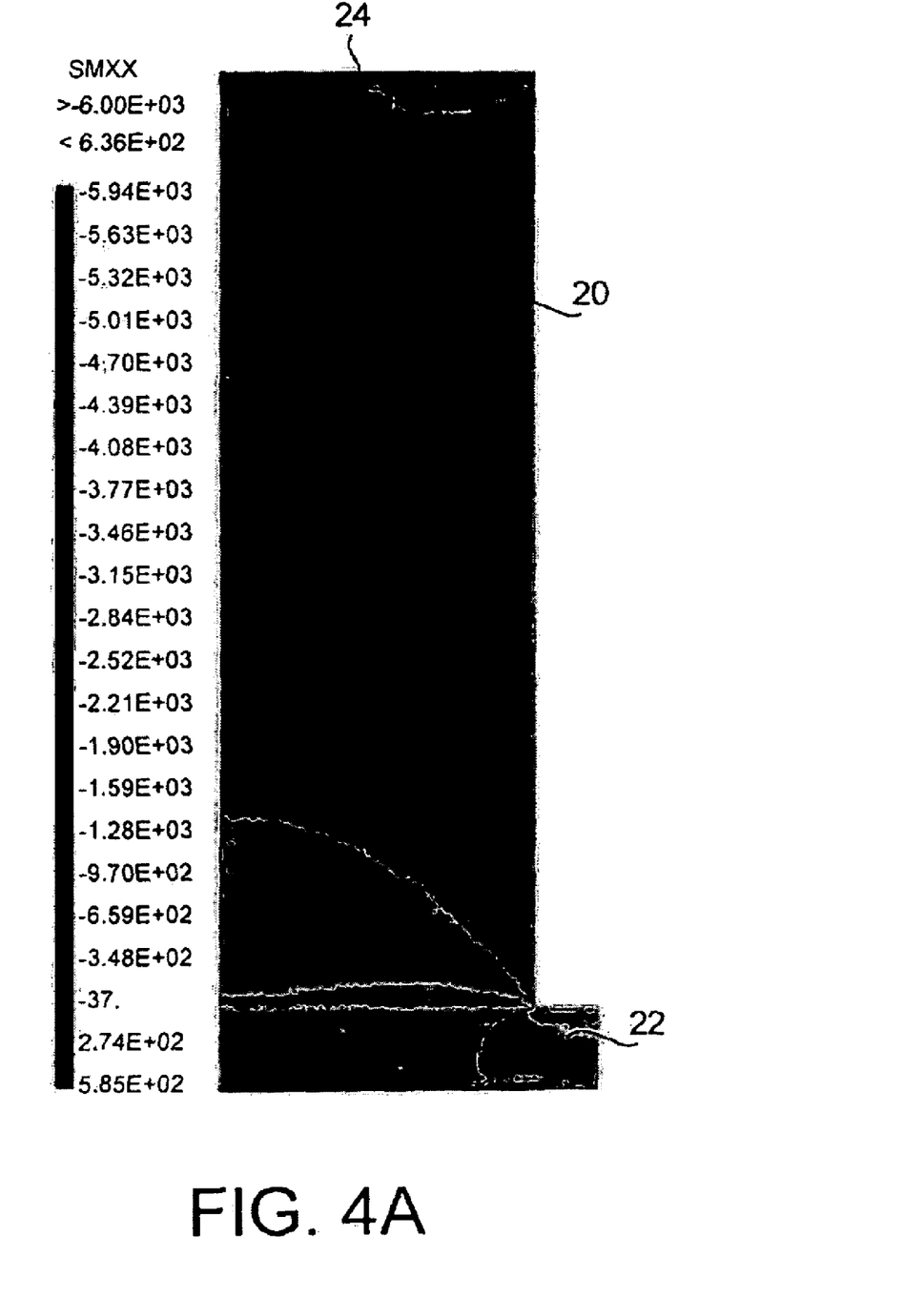
FIGS. 4A and 4B show a state of stress of a semiconductor film prepared according to the invention.
Figure 4B:
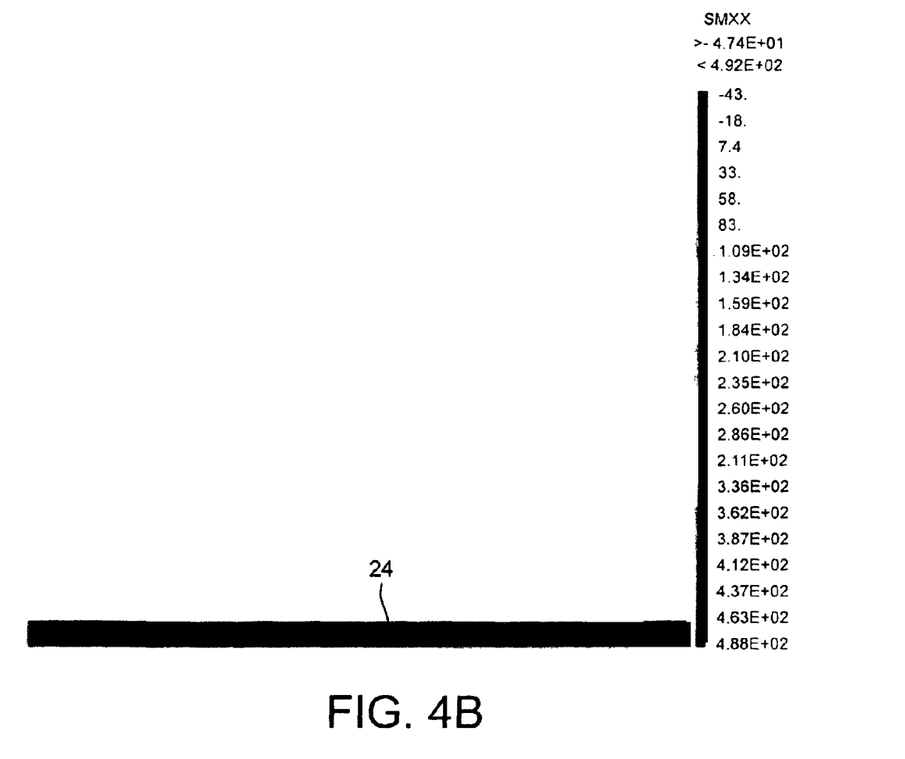

One embodiment of the invention is presented with reference to FIGS. 2 to 4.

FIG. 2 shows a prestressed layer 20 with thickness $e_o$ lying on the surface of a substrate 22 with thickness $e_s$.

This substrate is preferably made of silicon, but it could be made of any other material. It may also include one or several layers.

This substrate provides sufficient mechanical stiffness to limit relaxation of the prestressed layer 20 by any means other than etching.

For example, the layer 20 may be made of an amorphous material such as silicon nitride $Si_3N_4$.

It may also be crystalline, and in this case its pre-deformed state may have been obtained by hetero-epitaxy; in this case the difference in mesh size between the substrate 22 and the epitaxied surface of the material is used, the epitaxied thickness remaining less than the critical thickness beyond which the film 24 can relax its stress by itself by plastification (emission and sliding of dislocations). This state of deformation could also have been obtained by implantation of the layer to obtain a layer predeformed in compression, and therefore a thin pattern that will be in a tensioned state after etching. For example, germanium could be implanted for a silicon layer.

This prestressed layer may be insulating or conducting, but it is preferably electrically insulating (for example made of $Si_3N_4$) for applications such as control over transport properties by deformation of the channel of a MOS transistor, so as to limit leakage currents.

A buffer layer 23 could be deposited between the substrate 22 and the layer 20, so as to improve the mechanical strength of the stack. For example, this layer could be made of $SiO_2$.

This prestressed layer 20 is embedded under a layer 24 of a semiconducting material with thickness $e_{sc}$ in which the electronic transfer will take place.

The prestress is preferably biaxial in a plane perpendicular to the surface of the substrate 22; the two principal terms of the vector of stresses contained in this plane are equal and non-zero (they must be positive or negative), the principal term normal to the surface of the substrate being zero, or at least negligible compared with the other two terms.

One or several layers 26-1, . . . 26-i, . . . (all these layers as a whole are denoted by the single reference 26) with thicknesses denoted e1, . . . ei . . . respectively may be inserted between the prestressed layer 20 and the semiconducting layer 24 with thickness $e_{sc}$. These layers may be crystalline or amorphous, conducting or insulating depending on their function (bonding layer or other).

A substrate like that shown in FIG. 2 can be made as explained in the document entitled SOI Technology and Devices by O. RAYSSAC in Electro-Chemical Society Proceedings, Vol. 39 (2001).

Preferably, the sum of the thicknesses $e_i$, denoted $\Sigma e_i$ in the following, and $e_{sc}$ (thickness of layer 24) is small compared with $e_o$ (thickness of layer 20) and $e_o$ is small compared with $e_s$ (thickness of the substrate). This condition is not necessary for stressing the semiconducting layer, but it helps to optimise the <<transfer>> of stress from the prestressed layer 20 to the semiconducting layer 24.

The term <<stress transfer>> is not totally correct, since what is actually transmitted from the prestressed layer 20 to the layers 24, 26-i deposited on its surface is the deformation.

The following steps in a method according to the invention will now be described with reference to FIGS. 3A-3C. References in these figures that are the same as references in FIG. 2 represent identical or similar elements.

The semiconducting thin film 24 is etched to define the area in which the transistor sources, channel and drain will be located.

The width $l_{24}$ of the future transistor will 20 thus be defined as shown in FIG. 3A.

All intermediate films 26 between the semiconductor 24 and the prestressed layer 20 will be etched on the same side; this etching may be done sequentially or in a single step depending on the nature of the materials from which this part of the stack is made. This step is shown in FIG. 3B.

The prestressed layer 20 is then etched on each side of the pattern formed by etching layers 26 and 24 (FIG. 3C).

This etching can be done throughout the thickness of the prestressed layer 20, but it may also be done only on part of this layer depending on the required stress in the semiconducting layer.

This etching step can enable relaxation of the initial stress in the prestressed layer 20 and consequently constrain the stack 24, 26 located on its surface, including the semiconducting film 24 in which the carriers will be transported.

This step is shown in FIG. 3C. It leads to the formation of lateral cavities 28, 30 in layer 20.

Figure 7A:
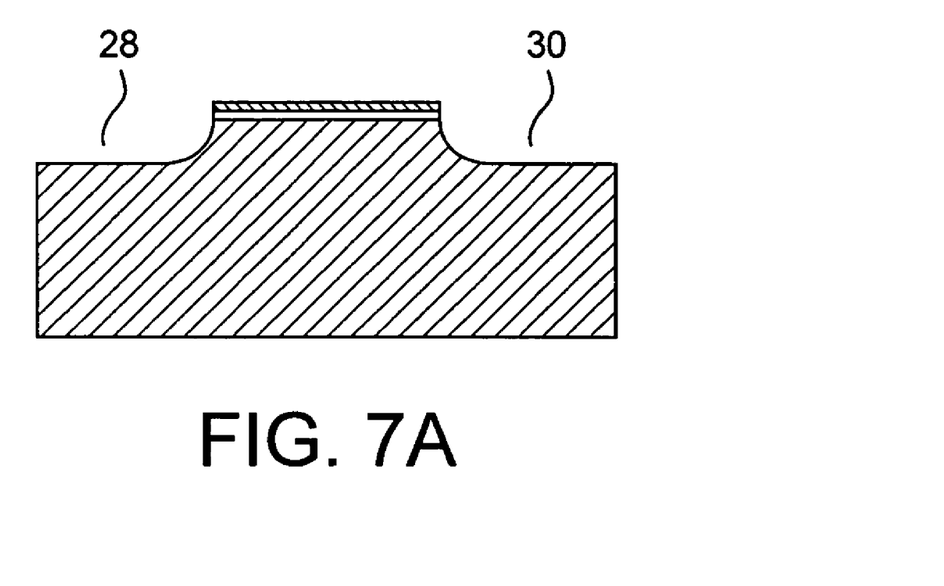
FIGS. 7A and 7B show a stack obtained after isotropic etching and anisotropic etching respectively.
Figure 7B:
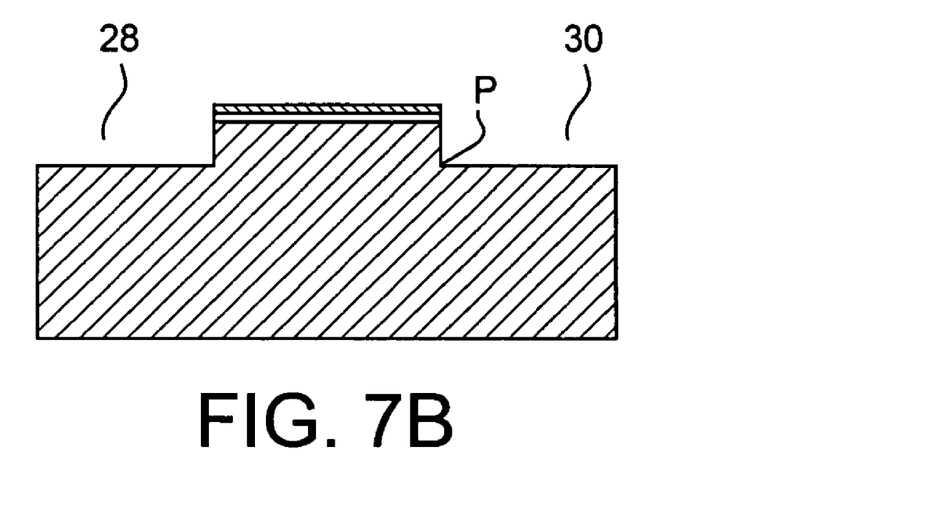

FIG. 7A represents the result of isotropic etching and FIG. 7B represents the result of anistropic etching (which can be used to obtain vertical walls).

The lateral cavities 28,30 formed in the stack can then be filled in, preferably using an electrically insulating material.

This material itself may be intrinsically or thermally stressed.

But this state of stress preferably reinforces the state of stress imposed by relaxation of the prestressed layer 20 obtained during the previous step; regardless of the origin of this stress (intrinsic to the technological method or induced by differences in the coefficients of expansion between the different materials involved), this stress in the materials in the lateral cavities for a channel 24 in tension (or in compression) is preferably a tension stress (or a compression stress) to reinforce the tension in the channel 24 at the working temperature.

Digital calculations have been made using the CASTEM® simulation system based on the <<finite elements>> technique so as to quantify the influence of etching steps described above on the state of stress of the thin semiconducting pattern 24.

The initial structure is the structure in FIG. 2, with a silicon substrate 22, a silicon nitride prestressed layer 20, a single intermediate silicon dioxide layer 26, and a silicon transport layer 24.

The geometric parameters and elastic properties of the materials in these different layers used for the calculations of the mechanical equilibrium after etching of the prestressed silicon nitride layer 20 are given in table 1 below, together with the calculation results.

This calculation was performed at ambient temperature and only the silicon nitride layer 20 was stressed initially.

TABLE I

| Substrate 22: Silicon Si | |
|---|---|
| Young's modulus: | 170 GPa |
| Poisson's ratio: | 0.278 |
| Thickness: | 30 μm |
| Prestressed layer 20: silicon nitride Si3N4 | |
| Young's modulus: | 380 GPa |
| Poisson's ratio: | 0.33 |
| Thickness: | 1.5 μm |
| Width after etching: | 1.0 μm |
| Stress: | −1.2 GPa |
| Intermediate layer 26: silicon oxide SiO2 | |
| Young's modulus: | 75 GPa |
| Poisson's ratio: | 0.165 |

TABLE I-continued

| Thickness: | 2 nm |
|---|---|
| Width after etching: | 1.0 μm |
| Transport layer 24: silicon Si | |
| Young's modulus: | 170 GPa |
| Poisson's ratio: | 0.278 |
| Thickness: | 20 nm |
| Width after etching: | 1.0 μm |

FIG. 4A shows one of the results obtained: the term $\sigma_{xx}$ for the stress vector (the X axis being taken parallel to the initial surface of the technological stack) is shown in the figure in the mass of materials using the code indicated on the scale at the left (expressed in MPa), and shows that the channel can be stressed using the method according to the invention.

FIG. 4B represents the stressed state of the single semiconducting layer 24 in the mass of materials, using the code indicated on the scale at the left (expressed in MPa).

It can be seen on these diagrams that the centre of the transport layer is stressed in tension by about 500 MPa.

A maximum value of the deformation of the semiconducting layer can be suggested immediately.

Assuming that:

the etching depth $h_g$ is such that the prestressing layer 20 can be completely relaxed at its top surface (the etching being done over a height equal to at least the width ($=l_{24}/2$ in FIG. 3A) of the defined pattern, layers 24 and 26 are thin compared with the etched depth $h_g$ and the sum of their thicknesses $\Sigma e_i$ is itself small compared with $h_g$, such that the prestressed layer 20 imposes its deformations on layers 24 and 26, then: the deformation imposed on layer 24 is equal to $-\epsilon_o$, which is the opposite of the initial deformation $\epsilon_o$ of the prestressed film 20.

This value $-\epsilon_o$ is the maximum value of the possible deformation of the film 24, and therefore in plane deformation it will correspond to a maximum possible stress equal to:

$$\sigma_{24}^{max} = -\frac{E_{24}}{1-V_{24}} \times \varepsilon_1 \quad \text{(eq. 1)}$$

where $E_{24}$ is the Young's modulus and $V_{24}$ is the Poisson's ratio of the semiconducting film 24, and $\epsilon_1$ is the deformation of the prestressed film 20 before the different etching steps.

According to Hook's law, this maximum stress can be expressed as a function of the stress applied to the prestressed film. The result is then:

$$\sigma_{24}^{max} = -\frac{E_{24}}{1-V_{24}} \times \frac{1-V_{20}}{E_{20}} \times \sigma_{20} \quad \text{(eq. 2)}$$

where $E_{20}$ is the Young's modulus and $V_{20}$ is the Poisson's ratio of the prestressed layer 20 and $\sigma_{20}$ is the stress in the prestressed film 20 before the different etching steps.

Using this equation 2 and the numeric values given in table 1, a maximum value of the stress in the semiconducting film is obtained equal to 498 MPa (rounded to the next lowest MPa).

Thus, a 10% improvement in the mobility of electrons can typically be obtained for a 100 nm gate of an NMOS transistor, and 20% can be obtained for a 10 μm gate.

This value of 498 MPa obtained by making an analytic estimate, is consistent with the numeric value obtained using the finite elements method equal to 492 MPa (value extracted at the centre of the thin pattern and rounded down to the nearest MPa).

This model shows that the nature of the materials directly affects the maximum possible stress value that can be achieved in the semiconducting pattern 24, since this maximum value is proportional to the ratio of the moduli of elasticity $E_{24}/E_{20}$ as is obvious from Equation 2 above.

If the working assumptions about the thicknesses of the different layers 24, 26 and the etching depth $h_g$ are no longer valid, the maximum possible stress could be significantly different from the value calculated in equation 2.

If the width of the thin semiconducting pattern 24 is of the same order of magnitude as its thickness, the maximum possible stress at the centre of this pattern will then be affected by the proximity of the edges of the patterns.

The normal stress on these edges is zero to satisfy the condition that this surface is free, and consequently $\sigma_{xx}$ becomes zero at this surface.

Therefore, the proximity of these free edges can significantly reduce the stress at the centre of the pattern if the pattern width is not large compared with its thickness.

Figure 5:
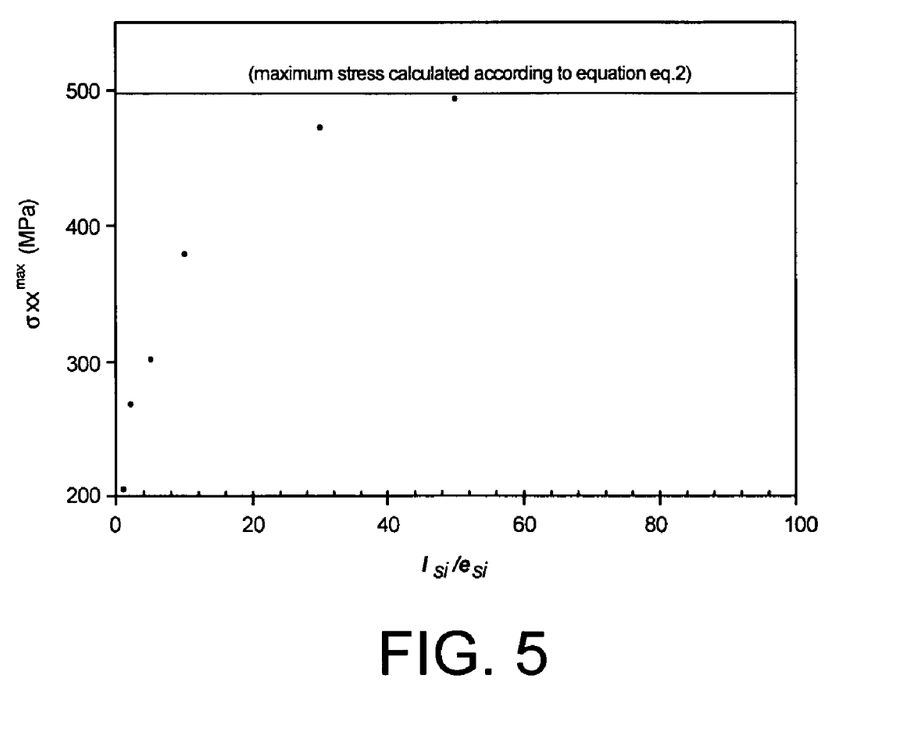
FIG. 5 shows the variation of the maximum of the σxx component of the stress in the semiconducting layer as a function of the ratio R1, 15 equal to the width of the pattern divided by its thickness $$\left(R1 = \frac{l_{si}}{e_{si}}\right).$$

This is shown in FIG. 5 that shows the variation of the maximum value of the component $\sigma_{xx}$ of the stress vector as a function of the width $l_{24}$ of the semiconducting pattern 24, where the thickness $e_{24}$ of this same pattern or film is fixed and equal to 20 nm. The values of the other parameters are as indicated in table I. The results given were obtained using the CASTEM® finite element program.

It can be seen that when the $l_{24}/e_{24}$ ratio is below a factor of 10, the maximum stress in the layer is already 20% lower than the maximum value estimated using the analytic approach. This small value is due to the small distance between the centre of the pattern and the free edges where by definition the stress cancels out, and therefore the narrowness of the pattern.

This analytic model ignores the effect of the depth $h_g$ on which the prestressed layer is etched, on the stress in the thin pattern 24.

The CASTEM® finite elements program was used to model this contribution.

Figure 6A:
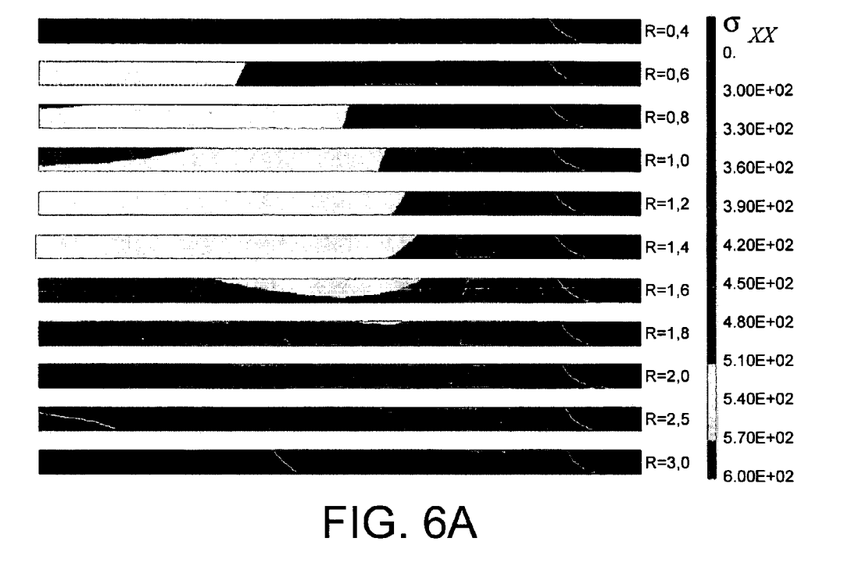
FIGS. 6A and 6B show the variation of the σxx stress field and the maximum value of the σxx component of the stress vector respectively, as a function of the ratio $$R = \frac{l_{24}}{2h_g}.$$

The variation of the stress $\sigma_{xx}$ in the thin film 24 as a function of the ratio $R_2=(l_{24}/2h_g)$ is shown in FIG. 6A in which the only value that is changed in the different calculations is $h_g$, and all other parameters including $e_{24}$ were fixed equal to the values shown in table 1.

Figure 6B:
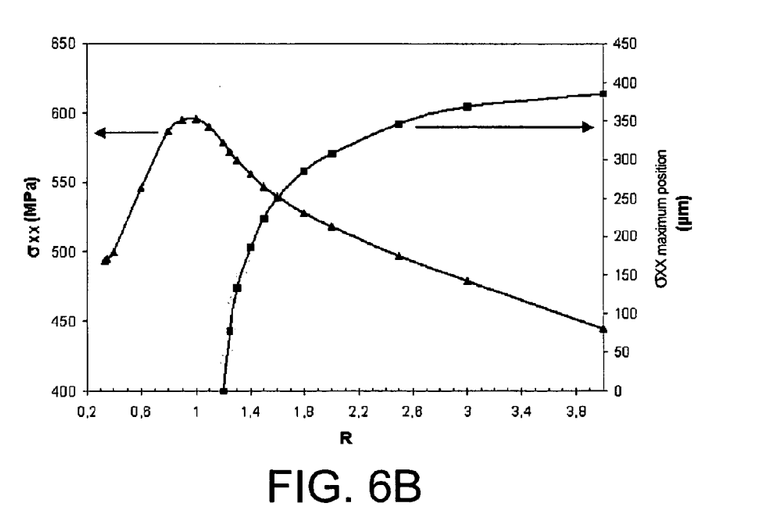

FIG. 6B also shows the variation of the maximum value of $\sigma_{xx}$ (left scale) and its position (starting from the edge of the pattern, right scale) as a function of $R_2$. The stress $\sigma_{xx}$ is obtained for an etched depth hg equal to the half-width $l_{24}/2$ of the pattern: in this configuration, the geometric singularity at the bottom of the etching introduces a state of stress that reinforces the tension state at the centre of the thin pattern. The bottom of the etching P (FIG. 7B) is the stress concentration location that is the starting point for a stress lobe induced by the <<peeling>> phenomenon that tends to separate the stressed film from its substrate. This stress lobe at the centre extends into the body of the etched film, and can very significantly reinforce the state of stress at the centre of the thin pattern, as shown in FIGS. 6A and 6B.

The value of 495 MPa is found for small values of R that correspond to large values of $h_g$, which validates the analytic approach of equation 2, and the stress drops well below this value of 495 MPa for large values of R that correspond to small values of $h_g$, because in this case the etched thickness y is then too small to enable complete relaxation of the prestressed layer.

This behaviour is perfectly symmetrical if the stress in the prestressed layer 20 is a tension stress; the above results are then produced in exactly the same way, except for the sign.

One important advantage of the method according to the invention is that it simplifies all of the first four steps described in U.S. Pat. No. 6,563,152 B2 into a single anisotropic etching of the prestressed 30 layer of the initial substrate.

This leads to the same result: constraining the channel of a transistor, or more generally constraining a thin pattern.

This advantageous simplicity of the method 5 according to the invention is reinforced by the fact that access areas (source and drain) of the transistor exist a priori in the proposed solution. Therefore there is no need to form them afterwards after stressing the channel as in document U.S. Pat. No. 6,563,152, which 10 avoids additional technological steps.

When the pattern is stressed, all that is necessary is to form the gate using the following technological steps:
fill in cavities 28 and 30, for example using a deposited oxide,
form the gate oxide,
form and etch the gate,
form spacers,
implantation/diffusion of source and drain access areas.
The result is thus a transistor.

Figure 8A:
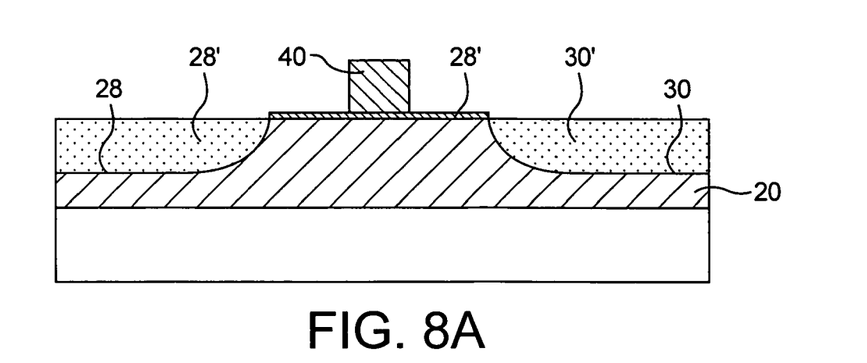
FIGS. 8A to 8C show steps in the production of a transistor according to a method conforming with the invention.
Figure 8B:
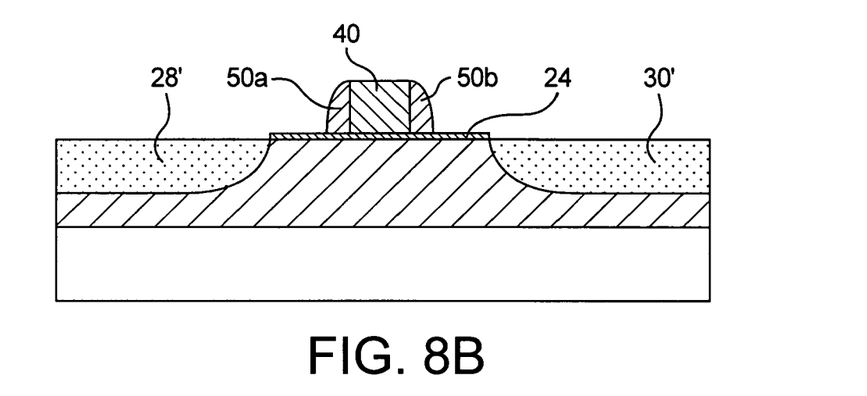
Figure 8C:
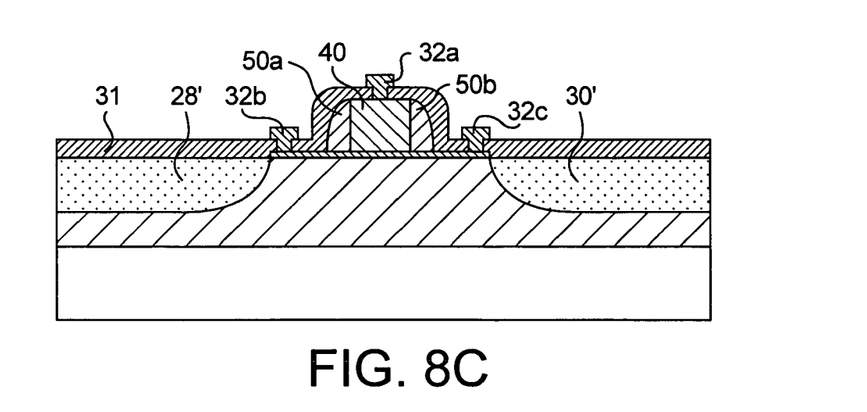

Production of a transistor will also be shown with reference to FIGS. 8A-8C.

Using the same notation as in FIGS. 7A and 7B, trenches 28 and 30 are filled in with a preferably insulating material 28', 30' respectively, the gate stack (diagrammatically shown as a single block 40 for simplification reasons) is deposited, and is then etched by standard photolithography and etching steps leading to the structure in FIG. 8A, after removal of the photosensitive resin.

A first so-called LDD implantation is then usually applied in this state.

Trenches are preferably filled in by an insulating material and/or a material that reinforces the deformation state of the thin film 24, imposed or increased by the lateral relaxation of the layer 20.

The formation of spacers 50a, 50b (FIG. 8B) usually includes a deposit of oxide ($SiO_2$), then nitride ($Si_3N_4$), this stack then being etched by anisotropic etching leaving an insulating strip on the edges of the gate that will form the said spacers.

Sources and drains are usually implanted in this state and a so-called nitriding step, possibly preceded by a selective epitaxy of sources and drains, reduces access resistances to the source, the drain and the gate by the formation of an alloy (for example NiSi) on the surface of these various areas.

The formed component can then be encapsulated in an electrically insulating layer 31 through which vias (local perforations of the encapsulation layer) are formed and then filled in by a metal (for example Cu) to transfer electrical contact points 32a, 32b and 32c to the top surface of the encapsulation layer (FIG. 8C).

The stressed channel component thus formed is then functional.

The invention claimed is:

1. A method for increasing a stress or a deformation in a layer starting from an initial component comprising said layer above a prestressed amorphous layer, the method comprising the steps of:
providing an initial component including the layer having a width above the prestressed amorphous layer, wherein the layer and the prestressed amorphous layer are differ-

9 ent materials and the prestressed amorphous layer is in a state of stress because it includes a deformation;

selecting a depth of etching for a portion of the prestressed amorphous layer as a function of the width of said layer above the prestressed amorphous layer to achieve a particular level of stress or deformation in said layer and reduce a level of stress in the prestressed amorphous layer; and etching said portion of the prestressed amorphous layer to the selected depth of etching, which relaxes the prestressed amorphous layer and transfers stress or deformation from the prestressed amorphous layer to said layer left above an unetched portion of said prestressed amorphous layer, which provides said layer left above the unetched portion of said prestressed amorphous layer with said particular level of stress or deformation.

2. The method according to claim 1, comprising etching the prestressed amorphous layer throughout its thickness.

3. The method according to claim 1, comprising etching the prestressed amorphous layer through only part of its thickness.

4. The method according to claim 1, further comprising a step of electronically insulating the prestressed amorphous layer.

5. The method according to claim 1, further comprising inserting one or several intermediate layers between the layer and the prestressed amorphous layer.

6. The method according to claim 5, further comprising setting a sum of the thicknesses of the intermediate layers and the thickness of the layer to be smaller than the etched thickness of the prestressed amorphous layer so as to optimize a transfer of stress from the prestressed amorphous layer to the pattern or the layer.

7. The method according to claim 1, comprising positioning the prestressed amorphous layer of the initial component on a substrate.

8. The method according to claim 7, further comprising setting the thickness of the prestressed amorphous layer before etching to be smaller than the thickness of the substrate so as to optimize a transfer of stress from the prestressed amorphous layer to the pattern or the layer.

9. The method according to claim 7, further comprising a step of placing a buffer layer or a mechanical resistance layer between the prestressed amorphous layer and the substrate.

10. The method according to claim 9, comprising a step of providing an $SiO_2$ buffer layer between the prestressed amorphous layer and the substrate.

11. The method according to claim 1, comprising forming lateral cavities in the prestressed amorphous layer.

12. The method according to claim 11, further comprising a step of filling the lateral cavities with a material.

13. The method according to claim 12, comprising providing said material used to fill the lateral cavities in a stressed state.

14. The method according to claim 13, comprising reinforcing the state of stress of the pattern or the layer resulting from etching and relaxation of the prestressed amorphous layer.

15. A method of forming a transistor, comprising the steps of:

providing a layer above a prestressed amorphous layer, said layer including areas that will form a source and drain for said transistor, etching at least a portion of the prestressed amorphous layer so as to leave the layer with the areas that will form the source and the drain for the transistor above an unetched portion of the prestressed amorphous layer,

10 forming lateral cavities in said prestressed amorphous layer with said etching, filling the lateral cavities with an insulating material in a stressed state, forming a gate oxide, forming and etching a gate on said layer, forming spacers on edges of said gate, performing implantation/diffusion of said areas in the layer above the prestressed amorphous layer to form the source and the drain.

16. The method according to claim 3, further comprising electronically insulating the prestressed amorphous layer.

17. The method according to claim 3, further comprising inserting one or several intermediate layers between the layer and the prestressed amorphous layer.

18. The method according to claim 17, further comprising setting the sum of the thicknesses of the intermediate layers and the thickness of the layer to be smaller than the etched thickness of the prestressed amorphous layer so as to optimize a transfer of stress from the prestressed amorphous layer to the layer.

19. The method according to claim 3, further comprising placing the prestressed amorphous layer on a substrate.

20. The method according to claim 19, further comprising setting the thickness of the prestressed amorphous layer before etching to be smaller than the thickness of the substrate so as to optimize a transfer of stress from the prestressed amorphous layer to the layer.

21. The method according to claim 19, further comprising placing a buffer layer or a mechanical resistance layer between the prestressed amorphous layer and the substrate.

22. The method according to claim 21, comprising providing an $SiO_2$ buffer layer between the prestressed amorphous layer and the substrate.

23. The method according to claim 3, further comprising forming lateral cavities in the prestressed amorphous layer.

24. The method according to claim 23, further comprising the step of filling the lateral cavities with a material.

25. The method according to claim 24, comprising providing the material used to fill the lateral cavities in a stressed state.

26. The method according to claim 25, further comprising reinforcing the state of stress of the layer resulting from etching and relaxation of the prestressed amorphous layer.

27. A method of forming a transistor according to claim 15, wherein said step of etching the prestressed amorphous layer is performed through only part of its thickness.

28. The method according to claim 1, comprising providing $Si_3N_4$ in said prestressed amorphous layer.

29. The method according to claim 3, comprising providing $Si_3N_4$ in said prestressed amorphous layer.

30. The method according to claim 1, wherein the step of selecting said depth of etching is performed based on the thickness of said layer above the prestressed amorphous layer.

31. The method according to claim 30, wherein the step of selecting said depth of etching is further based on the Young's modulus of said layer above the prestressed amorphous layer and on Poisson's ratio of said layer above the prestressed amorphous layer.

32. The method according to claim 30, wherein the step of selecting said depth of etching is further based on the Young's modulus of said prestressed amorphous layer and on Poisson's ratio of said prestressed amorphous layer.

33. The method according to claim 1, wherein the selecting includes selecting the depth of etching for the portion of the prestressed amorphous layer that is equal to half the width of said layer above the prestressed amorphous layer to achieve the particular level of stress or deformation in said layer, due to a geometric singularity at a bottom of the etching, that reinforces a tension state at a center of the layer above the prestressed amorphous layer.

34. The method according to claim 33, wherein the bottom of the etching is a stress concentration location that is a starting point for a stress lobe induced by a peeling phenomenon that tends to separate the prestressed amorphous layer from its substrate.

35. The method according to claim 1, wherein the deformation of the pre-stressed layer was obtained by implantation.

* * * * *